United States Patent [19]

Potard

[11] Patent Number: 4,617,084
[45] Date of Patent: Oct. 14, 1986

[54] PROCESS FOR THE PRODUCTION OF METALLIC OR SEMIMETALLIC SHAPED ELEMENTS

[75] Inventor: Claude Potard, St. Egreve, France

[73] Assignee: Commissariat a l'Energie Atomique, Paris, France

[21] Appl. No.: 632,799

[22] Filed: Jul. 20, 1984

[30] Foreign Application Priority Data

Jul. 29, 1983 [FR] France .................. 83 12548

[51] Int. Cl.$^4$ .................................. C30B 27/02
[52] U.S. Cl. ...................... 156/607; 156/608; 156/616 A; 156/DIG. 84; 156/DIG. 98
[58] Field of Search ............... 156/607, 608, 616 R, 156/616 A, 617 SP, 617 H, 624, DIG. 64, DIG. 84, DIG. 88, DIG. 98; 422/254, 249

[56] References Cited

U.S. PATENT DOCUMENTS

| | | | |
|---|---|---|---|
| 2,872,299 | 2/1959 | Celmer et al. | 156/617 SP |
| 2,875,108 | 2/1959 | Pfann | 148/1 |
| 3,025,146 | 3/1962 | Runyan | 156/608 |
| 3,687,633 | 8/1972 | Belle, Jr. et al. | 156/608 |
| 4,213,940 | 7/1980 | Zerbst | 156/DIG. 88 |
| 4,496,424 | 1/1985 | Terashima et al. | 156/607 |

FOREIGN PATENT DOCUMENTS

| | | | |
|---|---|---|---|
| 407415 | 3/1924 | Fed. Rep. of Germany. | |
| 2300989 | 7/1974 | Fed. Rep. of Germany. | |
| 3003717 | 8/1981 | Fed. Rep. of Germany | 156/607 |
| 100718 | 6/1982 | Japan | 156/616 R |
| 1039364 | 8/1966 | United Kingdom | 156/DIG. 84 |

OTHER PUBLICATIONS

A. V. Stepanov, New Methods of Producing Articles (Sheets, Tubes, Rods, Various Sections, Etc.) Directly from Liquid Metal, I*, Summary of the 1941 Report of the Leningrad Phyicotechnical Institute, Acad. Sci., USSR, pp. 339-348.

J. C. Swartz et al., The EFG Process Adapted to the Growth of Silicon Ribbons, Journal of Electronic Materials, vol. 4, No. 2, 1975, pp. 255-278.

J. R. Carruthers et al., Studies of Floating Liquid Zones in Simulated Zero Gravity, J. Appl. Phys. vol. 43, No. 2, Feb. 1972, p. 436.

*Primary Examiner*—David L. Lacey
*Attorney, Agent, or Firm*—Pearne, Gordon, Sessions, McCoy, Granger & Tilberry

[57] ABSTRACT

Process for the preparation of metallic or semimetallic shaped elements, particularly of silicon, in a molten coating bath.

Into a confinement crucible is placed the molten basic semimetallic metallic material and a molten coating bath which is inert with respect to said material and whose melting temperature is below that of the material. Into the material is introduced at least one frame-like part, made from a refractory material whose thickness for wetting is greater with respect to the metallic or semimetallic material than with respect to the molten coating bath. A metallic or semimetallic material shaped element is then produced on the frame by the slow displacement of all or part thereof. This shaped element is solidified in the liquid coating bath and finally the complete frame and the solidified shaped element are removed from the bath.

9 Claims, 6 Drawing Figures

U.S. Patent  Oct. 14, 1986  Sheet 2 of 2  4,617,084

PROCESS FOR THE PRODUCTION OF METALLIC OR SEMIMETALLIC SHAPED ELEMENTS

BACKGROUND OF THE INVENTION

The present invention relates to the field of the production of thin or solid metallic or semimetallic shaped elements and in particular silicon plates for photovoltaic uses.

It is known to produce silicon tapes or plates by solidification of the liquid entrained by capillary adhesion onto refractory supports. In such processes, the entrainment of the liquid is reduced as a result of the forces of gravity and instabilities of the surfaces and liquid meniscuses. Thus, these disadvantages lead to the solidification of small, relatively unusable surfaces or to carrying out, in a continuous process, a precise control or inspection of the liquid shapes prior to solidification. Moreover, it is difficult to envisage shapes other than plates or tapes.

SUMMARY OF THE INVENTION

The present invention specifically relates to a process for the preparation of flat, hollow or solid metallic or semimetallic shaped elements or forms which makes it possible, by using simple means, to produce these directly as from the shaping of the liquid and has the advantage of considerably reducing production costs.

The present invention therefore relates to a process for the preparation of metallic or semimetallic shaped elements, particularly of silicon, in a molten coating bath, in which in a refractory confinement crucible is placed the basic metallic or semimetallic material in the molten state and a molten coating bath inert with respect to the material and whose melting temperature is below that of the material, wherein into the material is introduced at least one frame-like part made from a refractory material, whose thickness for wetting is greater relative to the metallic or semimetallic material than relative to the molten coating bath and then, by the slow displacement of all or part of the frame shaped element, form or diaphragm of said metallic or semimetallic material is produced on the latter and is solidified by cooling in the liquid coating bath, finally, the complete frame and the solidified shaped element or diaphragm being removed from the bath.

According to a first embodiment, the density of the molten bath must be close to that of the metallic or semimetallic material at its melting point. In this embodiment, the choice of the bath has the aim of compensating the weight of the metallic or semimetallic material to be shaped. This compensation of the gravity forces also makes it possible to increase the effect of the capillarity forces.

Thus, the process according to the invention is essentially based on the formation of hollow or solid volumes or shaped elements from liquid or semiliquid metal by drawing out within a support liquid. In the case of the formation of plates, the molten liquid metal or semimetal in a support bath is contained within a confinement crucible, drawn over a flat refractory material frame in order to form a diaphragm having parallel faces. It is then solidified in this form within the actual bath, during the cooling of the confinement crucible, the metal or semimetal sheet solidified in this way on the frame being disengaged before the solidification of the bath, whose melting point is lower than that of the metal.

The process according to the invention mainly makes use of the different thickness or suitability properties for wetting of the liquid metal on the one hand and a coating bath on the other, with respect to the refractory materials constituting the frame-like part. No matter what the chosen materials, it is necessary for the process according to the invention to be completely efficient for the molten metal or semimetal to have the property of satisfactorily wetting the refractory material constituting the frame.

The stability of the liquid metal or semimetal surfaces is increased by contact with the molten bath and the densities of the molten bath and the metal or semimetal are made very close, so that the liquid semimetal or metal volumes can be supported in the molten bath.

Solidification can take place in a directional manner, so as to produce appropriate crystalline structures, particularly for photovoltaic use in the case of silicon.

According to a secondary, but important feature of the invention, the molten bath used has a density slightly below that of the metallic or semimetallic material, which then adheres by wetting to the bottom of the confinement crucible.

According to a variant, the molten bath has a density equal to or very close to that of the molten metallic or semimetallic material and the latter collects in the form of a single drop with a roughly spherical shape in the crucible and the frame-like part is deformable, one of the sides of the frame being mounted so as to slide along two other adjacent sides.

According to another variant, the molten bath has a density which is slightly higher than that of the molten metallic or semimetallic material, the latter then collecting in the form of a lump floating on the surface of the bath and the frame is introduced through the metallic or semimetallic lump into the molten bath.

According to a preferred embodiment of the process according to the invention, the treated material is silicon, which is produced directly in plate form. The part which has a shape corresponding to the frame is either produced entirely from the molten mass material or by coating a refractory metal chosen from the group consisting of tungsten, molybdenum, tantalum, or silicon carbide onto a substrate mounted to the frame.

According to a variant of the above embodiment, the refractory material used for the frame-like part is zirconia or thoria.

In the case of silicon, the molten baths are preferably mixtures of fluorides chosen from among calcium, magnesium and barium, and particularly the eutectic composition $CaF_2MgF_2$ having 55.6% by weight of $CaF_2$.

According to a second embodiment, applicable to the performance of the process when there is no gravity or microgravity, the respective densities of the metallic or semimetallic material and the bath can be of a random nature. As a result of the absence of gravity force, the material is still in neutral equilibrium in the molten bath.

BRIEF DESCRIPTION OF THE DRAWINGS

The invention is described in greater detail hereinafter relative to non-limitative embodiments and the drawings herein show.

DETAILED DESCRIPTION OF THE PREFERRED EMBODIMENTS

The drawings do not show the heating and cooling means required for the crucible and for the performance of the process, which are of a per se known type and which do not form part of the invention.

The following embodiments solely relate to the production of silicon plates for photovoltaic uses, but it is obvious that this must not be looked upon as a limitation of the scope of the invention and that a priori this relates to all metallic or semimetallic materials which it might be wished to obtain with the aid of a diaphragm solidification process.

Figure 1:
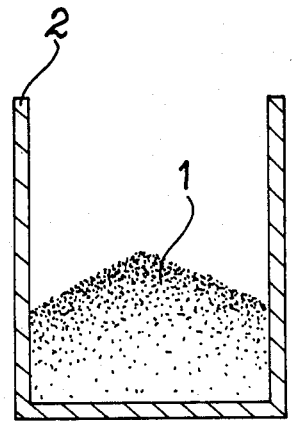
FIG. 1 a graphite crucible filled with solid silicon.
Figure 2:
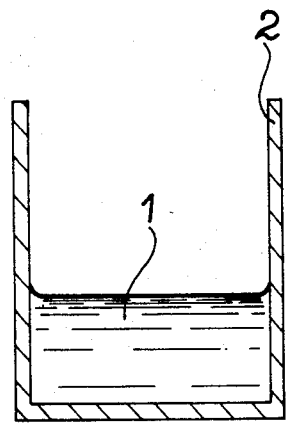
FIG. 2 the same crucible after melting the silicon with the aid of a not shown hot source.
Figure 3:
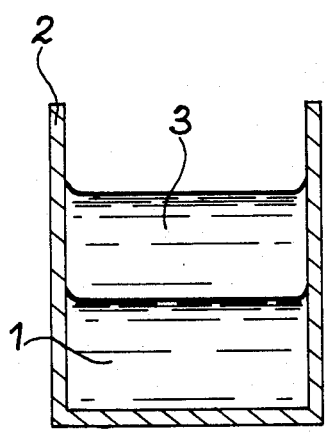
FIG. 3 the same crucible after adding a molten bath.

The first four drawings relate to the description of the embodiment of the invention involving pulling or drawing a diaphragm within a liquid silicon layer. For this purpose, the silicon 1 is firstly deposited and then melted in a graphite or silicon carbide crucible 2 having a high purity and which is maintained in a molten state until equilibrium wetting is obtained (FIG. 2). It can be seen that the liquid silicon adheres to the graphite crucible. An adequate coating bath volume 3 constituted by the eutectic $CaF_2MgF_2$ is then poured on the surface of the silicon. At a temperature of 1450° C., this eutectic has a density slightly below that of the liquid silicon.

According to the invention, a refractory material frame 4, whose wetting by the silicon exceeds that of the bath 3 and which has appropriate dimensions is then immersed in the molten silicon layer 1. It is kept there until it has been continuously wetted by liquid silicon 1.

This is followed by a slow vertical upward extraction of frame 4 from layer 1 and frame 4 by attachment entrains a silicon diaphragm, which remains in place whilst the frame 4 remains in the bath volume 3 surmounting the silicon bath 1.

Figure 4:
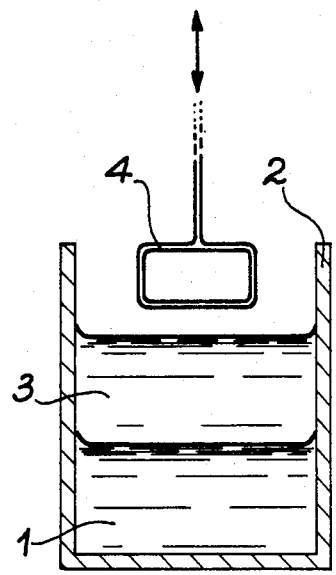
FIG. 4 the initial position of the introduction and the final position of removing the refractory material frame-like part.

At this time and using conventional not shown means, the liquid mass contained in crucible 2 is cooled, which brings about the solidification of the silicon plate on frame 4 and permits the withdrawal of the latter, provided with its solid plate, from bath 3. FIG. 4 only shows one frame, but obviously several of these could be used.

Figure 5:
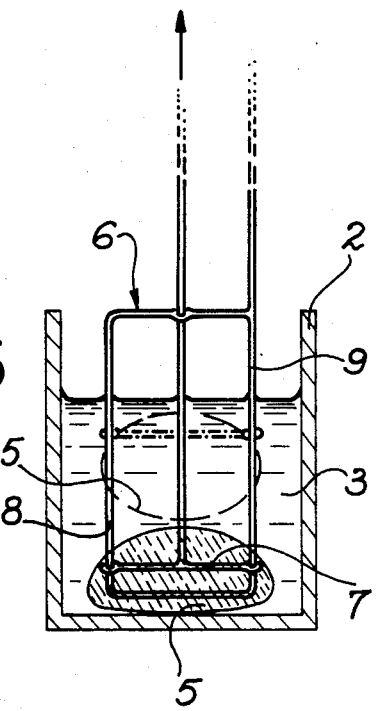
FIG. 5 the graphite crucible filled with the molten bath in the case where the liquid metal is collected at the bottom of the crucible in the form of a single drop deformed without wetting towards the crucible.
Figure 6:
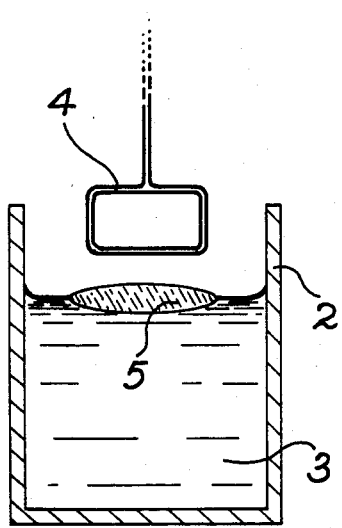
FIG. 6 the situation complementary to FIG. 5, i.e. the case where the molten bath in the graphite crucible has a density slightly above that of the molten material, which collects in the form of a lump on the surface of the bath.

FIGS. 5 and 6 illustrate a variant of the present embodiment of the process according to the invention, in which the silicon is collected by drawing a drop either in neutral equilibrium, or positioned at the bottom of the crucible (FIG. 5—continuous or broken line drop), or floating on the surface of bath 3 (FIG. 6).

For this purpose, a mixture in a predetermined proportion of $CaF_2MgF_2$ and silicon in fragment form is melted in a crucible 2. On regulating the density of bath 3, whilst modifying its composition, so that it is slightly below that of the molten silicon, the latter then collects at the bottom of crucible 2 in the form of a single drop 5, where it settles and remains with a roughly spherical shape.

According to the invention, a deformable, refractory material frame 6, wetted in preferred manner by silicon and whose lower side 7 can slide along vertical, lateral posts 8 and 9 is introduced. The lower side 7 is brought into contact with the silicon drop 5, which then adheres to frame 6 and is partly drawn on posts 8, 9. The extension of drop 5 is completed by the upward movement of the movable side 7 of the frame up to the desired size for the plate.

The solidification of the silicon can then start by directed cooling of the liquid contained in crucible 2 with the aid of conventional means not shown in FIG. 5 and this solidification is completed prior to the full extraction of the silicon plate from molten bath 3.

In a variant of this process, the density of bath 3 is increased, so that the equilibrium position of silicon drop 5 is in the form of a lump on the surface of molten bath 3. A non-deformable frame 4 is then lowered through the silicon lump 5 to bring about its attachment and its downward drawing until immersed in bath 3. Solidification takes place directionally as in the preceding embodiments. In a variant of the process for forming random volumes, the frames used have geometries corresponding to the edges of the desired volumes, which can be full or empty of the metallic or semimetallic material.

The general explanations of the process according to the invention have now been given and will be followed by three specific examples of applications of the process to the production of silicon plates by solidification of diaphragms.

EXAMPLE 1

A cylindrical graphite crucible is used containing a liquid silicon volume over a height of approximately 8 cm. The liquid silicon adheres to the graphite after 30 minutes of maintaining the temperature at 1450° C. under an argon atmosphere.

A $CaF_2MgF_2$ eutectic volume melting at 980° C. is then poured onto the liquid silicon surface to form an approximately 8 cm thick layer. As from the end of this operation, a square tungsten frame with 5 cm edges is rapidly immersed in the silicon bath through the molten eutectic layer. After holding for approximately 3 minutes, the frame is removed from the silicon at a speed of 1 cm/minute.

A silicon diaphragm is then entrained by the frame and when the latter is removed from the silicon bath, but still in the molten eutectic medium, solidification starts by oriented, programmed cooling.

The frame and the solidified diaphragm are then removed from the bath. A second operation can then commence by remelting the silicon mass.

EXAMPLE 2

A pure graphite crucible containing the eutectic $CaF_2MgF_2$ and silicon in an adequate quantity corresponding to the desired plate is heated to beyond the melting point of the silicon i.e. approximately 1450° C. The silicon then systematically collects in the form of a single drop under the action of the surface-active properties of the agents present. This drop is positioned at the bottom of the graphite crucible.

A tungsten frame having an extensible shape, but with a reduced configuration is then introduced until it is in contact with the silicon drop (FIG. 5). By wetting,- the silicon is attached to the close together posts of the frame and stabilizes in a few minutes.

The development of the surface of the frame can then commence by a vertical movement of its lower post 7 at a speed of approximately 1 cm per minute. When the surface is developed, the attached silicon diaphragm is then solidified in the liquid eutectic before being removed.

EXAMPLE 3 (FIG. 6)

As in example 2, the silicon drop is formed in a bath and in this case its density is higher than that of the liquid silicon. Its density is adjusted by using barium fluoride and to this end it is possible to use a binary mixture of 70% by weight $CaF_2$ and 30% by weight $BaF_2$, which permits an adequate, but not excessive supporting of the silicon drop on the surface of the bath, so as to form a lump.

The non-deformable tungsten frame is then brought into contact with the silicon lump and the latter extends horizontally by capillarity until it touches the two lateral posts of the frame. The bath density must not excessively exceed that of the liquid silicon, because it would be impossible to form a plate, the silicon drop having difficulties in dropping by capillary entrainment.

Immersion continues at a rate of 1 cm/minute until it is complete. The diaphragm entrained within the bath is then solidified in a directional manner and is then removed therefrom. A second drop can be introduced into the bath and the operation continues in the same way with another frame.

However, the invention is not strictly limited to the process for the preparation of metallic plates in the manner described and in fact extends, if desired, to obtaining the shaped elements defined by the edges of frames with different geometrical configurations and with the liquid silicon faces maintained between these edges. It is thus possible to obtain silicon receptacles or parallelepipedic shaped elements having parallel or even crooked faces. To this end, parts serving the function of the aforementioned frame for obtaining flat metal plates can be made with the aid of parallelepipedic tungsten bar configurations or other refractory materials preferably wetted by silicon.

Moreover, it is obvious that as the metal or molten alloy has a density close to that of the liquid coating bath, which is chemically inert with respect to said metal or said alloy, it is possible to use the process according to the invention for obtaining solids having the various shapes referred to hereinbefore on the basis of said metals or alloys. The materials constituting the frame are then still chosen so as to be preferably wetted by the metal or alloy.

Finally, molten materials of various shapes can be obtained according to the process of the invention in the absence of gravity or microgravity on board artificial earth satellites.

What is claimed is:

1. A process for the preparation of a shaped element composed of metallic or semimetallic material, comprising the steps of:
   (a) placing the metallic or semimetallic material in a refractory confinement crucible, and bringing the metallic or semimetallic material to a molten state;
   (b) placing a molten coating bath in said crucible, said coating bath being composed of a substance that is inert with respect to the metallic or semimetallic material, having a melting temperature below that of the metallic or semimetallic material, and having a density close to that of the metallic or semimetallic material at its melting point;
   (c) introducing into the metallic or semimetallic material a frame, said frame being composed of a refractory material and having a thickness for wetting greater relative to the metallic or semimetallic material than relative to the molten coating bath and said frame defining an element area;
   (d) producing a shaped element of the metallic or semimetallic material on the frame, said shaped element corresponding to the shape of said element area and being produced by slow displacement of all or part of the frame and solidification of the metallic or semimetallic material by cooling in the liquid coating bath; and
   (e) removing the frame having the solidified shaped element from the bath.

2. A process for the preparation of a metallic or semimetallic shaped element according to claim 1, wherein the molten coating bath has a density slightly below that of the metallic or semimetallic material, the metallic or semimetallic material adhering by wetting to the bottom of the confinement crucible.

3. A process for the preparation of a metallic or semimetallic shaped element according to claim 1, wherein the molten coating bath has a density equal to or very close to that of the molten metallic or semimetallic material and the metallic or semimetallic matieral collects in the form of a single drop with a roughly spherical shape in the crucible, and the frame is deformable and has at least three sides, one of the sides of the frame being mounted so as to slide along two other adjacent sides of said at least three sides.

4. A process for the preparation of a metallic or semimetallic shaped element according to claim 1, wherein the molten coating bath has a density which is slightly higher than that of the molten metallic or semimetallic material, the metallic or semimetallic material then collecting in the form of a lump floating on the surface of the bath and the frame is introduced through the metallic or semimetallic lump into the molten bath.

5. A process for the preparation of metallic or semimetallic shaped element according to claim 1, wherein the metallic or semimetallic material is silicon and the frame is composed of a refractory material chosen from the group consisting of tungsten, molydbenum, tantalum, and silicon carbide.

6. A process for the preparation of a metallic or semimetallic shaped element according to claim 5, wherein the molten bath is a mixture of fluorides chosen from the group consisting of calcium, magnesium and barium.

7. A process for the preparation of a metallic or semimetallic shaped element according to claim 1, wherein the metallic or semimetallic material is silicon and the frame is composed of a refractory material chosen from the group consisting of refractory oxides.

8. A process for the preparation of a metallic or semimetallic shaped element according to claim 7, wherein the refractory material is chosen from the group consisting of thoria and zirconia.

9. A process for the preparation of a shaped element composed of metallic or semimetallic material, comprising the steps of:
   (a) placing the metallic or semimetallic material in a refractory confinement crucible, and bringing the metallic or semimetallic material to a molten state;

(b) placing a molten coating bath in said crucible, said coating bath being composed of a substance that is inert with respect to the metallic or semimetallic material having a melting temperature below that of the metallic or semimetallic material and the respective densities of the bath and the material are of a random nature, (c) introducing into the metallic or semimetallic material a frame, said frame being composed of a refractory material having a thickness for wetting greater relative to the metallic or semimetallic material than relative to the molten coating bath and said frame defining an element area;

(d) producing a shaped element of the metallic or semimetallic material on the frame, said shaped element corresponding to the shape of said element area and being produced by slow displacement of all or part of the frame and solidification of the metallic or semimetallic material by cooling in the liquid coating bath;

(e) removing the frame having the solidified shaped element from the bath; and (f) performing steps a-e in the absence of gravity or microgravity.

* * * * *